(12) United States Patent
Gambetta (10) Patent No.: US 9,285,397 B2
(45) Date of Patent: Mar. 15, 2016

(54) TEMPERATURE AND SUPPLY VOLTAGE INDEPENDENT DC-DC CURRENT SENSING

(71) Applicant: Dialog Semiconductor GmbH, Kirchheim/Teck-Nabern (DE)

(72) Inventor: Pietro Gambetta, Munich (DE)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 210 days.

(21) Appl. No.: 14/200,594

(22) Filed: Mar. 7, 2014

(65) Prior Publication Data

US 2015/0115985 A1 Apr. 30, 2015

(30) Foreign Application Priority Data

Oct. 30, 2013 (EP) .................................... 13190864

(51) Int. Cl.
| | | |
|---|---|---|
| *G01R 31/00* | (2006.01) | |
| *G05F 1/573* | (2006.01) | |
| *G01R 19/00* | (2006.01) | |
| *G01R 19/32* | (2006.01) | |
| *H03K 17/14* | (2006.01) | |

(52) U.S. Cl.
CPC ................ *G01R 19/00* (2013.01); *G01R 19/32* (2013.01); *H03K 17/145* (2013.01); *G01R 19/0092* (2013.01); *H03K 2217/0027* (2013.01)

(58) Field of Classification Search
CPC .... G01R 19/00; G01R 19/32; G01R 19/0092; H03K 17/145; H03K 2217/0027
USPC ........ 324/76.11, 123 R, 713, 750.01–750.03; 323/277
See application file for complete search history.

(56) References Cited

U.S. PATENT DOCUMENTS

| | | | |
|---|---|---|---|
| 5,635,823 | A | 6/1997 | Murakami et al. |
| 2006/0256492 | A1 | 11/2006 | Zhao et al. |
| 2009/0079415 | A1* | 3/2009 | Amada ............... G01R 19/0092 324/76.11 |

FOREIGN PATENT DOCUMENTS

| | | |
|---|---|---|
| EP | 0 483 744 | 6/1992 |
| EP | 0706265 | 10/1994 |

OTHER PUBLICATIONS

European Search Report 13190864.2-1560 Mailed: Apr. 14, 2014, Dialog Semiconductor GmbH.

* cited by examiner

*Primary Examiner* — Jermele M Hollington
*Assistant Examiner* — Farhana Hoque
(74) *Attorney, Agent, or Firm* — Saile Ackerman LLC; Stephen B. Ackerman (57) ABSTRACT

The present document relates to a current sensing circuit. In particular, the present document relates to a current sensing circuit which provides reliable indications of the current through a transistor. A current sensing circuit configured to provide an indication of a load current through a pass device is described. The current sensing circuit comprises a sensing replica of the pass device and a sensing resistor arranged in series with the sensing replica. The sensing resistor is arranged such that a voltage drop at the sensing resistor provides an indication of the load current through the pass device.

21 Claims, 5 Drawing Sheets

TEMPERATURE AND SUPPLY VOLTAGE INDEPENDENT DC-DC CURRENT SENSING

TECHNICAL FIELD

The present document relates to a current sensing circuit. In particular, the present document relates to a current sensing circuit which provides reliable indications of the current through a transistor.

BACKGROUND

Power converters and in particular switched mode power converters typically make use of one or more power switches which are commutated between an on-state and an off-state in an alternating manner at a commutation cycle rate. The one or more power switches may be controlled in dependence of the current flowing through the one or more power switches. By way of example, a power switch may be commutated from an on-state to an off-state, subject to the detection that the current through the power switch has reached a pre-determined peak current.

In order to be able to accurately control the states of a power switch based on the current flowing through the power switch, current measurement means are desirable which are configured to provide an accurate indication of the current flowing through the power switch. Such an indication should be substantially independent of the operational conditions of the power switch, such as the temperature and/or the supply voltage at which the power switch is operated. The present document describes such current measurement means (also referred to herein as current sensing circuits).

SUMMARY

According to an aspect, a current sensing circuit configured to provide an indication of a load current through a pass device is described. The pass device may be a metal oxide semiconductor (MOS) transistor, e.g. a p-type or n-type transistor. The current sensing circuit comprises a sensing replica of the pass device, which may also be a MOS transistor, e.g. a p-type or n-type transistor. The pass device and the sensing replica may be controlled in synchronicity. This may be achieved by driving the pass device and the sensing replica via their gates using the same driver.

The current sensing circuit comprises a sensing resistor arranged in series with the sensing replica, such that a voltage drop at the sensing resistor provides an indication of the load current through the pass device. For this purpose, the sensing replica and the sensing resistor may be arranged in parallel to the pass device. By doing this, the voltage drop across the pass device (which is indicative of the load current through the pass device) corresponds to the voltage drop across the serial arrangement of the sensing resistor and the sensing replica. The sensing resistor and the sensing replica may form a voltage divider, such that the voltage drop at the sensing resistor is indicative of the load current through the pass device.

The sensing replica may exhibit an on-resistance which is larger than the on-resistance of the pass device by a pre-determined scaling factor N. In particular, Ron(SF)=N·Ron(PD), wherein Ron(SF) is the on-resistance of the sensing replica and wherein Ron(PD) is the on-resistance of the pass device. In such a case, the voltage drop at the sensing resistor may be given by $$V_{Rs} = I_L \cdot Ron(PD) \cdot \frac{R_s}{R_s + N \cdot Ron(PD)},$$

wherein $V_{Rs}$ is the voltage drop at the sensing resistor, wherein $I_L$ is the load current through the pass device, and wherein $R_s$ is the resistance of the sensing resistor. As can be seen from the above formula, the voltage drop at the sensing resistor may be dependent on the on-resistance of the pass device.

The current sensing circuit further comprises a transformation circuit configured to transform the voltage drop at the sensing resistor into an output current, such that the output current is indicative of the voltage drop at the sensing resistor divided by a compensation resistance of a compensation circuit. The compensation resistance may exhibit a dependency on the on-resistance of the pass device which corresponds to the dependency on the on-resistance of the pass device of the voltage drop at the sensing resistor. In other words, the compensation circuit may be configured to remove the dependency of $V_{Rs}$ on the on-resistance of the pass device Ron(PD). As a result of this, the current sensing circuit provides reliable indications of the load current $I_L$, which are independent of the operational conditions of the pass device (such as the temperature and the supply voltage $V_{DD}$).

In particular, the compensation resistance may be proportional to $$\frac{N \cdot Ron(PD)}{R_s + N \cdot Ron(PD)},$$

wherein $R_s$ is the resistance of the sensing resistor, wherein Ron(PD) is the on-resistance of the pass device, and wherein N is the scaling factor between the sensing replica and the pass device. Typically, the pass device is N times larger than the sensing replica, and the on-resistance of the pass device is N times smaller than the on-resistance of the sensing replica. As can be seen, the above compensation resistance may be used to remove the Ron(PD)-dependency of the voltage drop $V_{Rs}$ at the sensing resistor.

The compensation circuit may comprise a parallel arrangement of a compensation resistor and of a compensation replica of the pass device. The compensation replica may exhibit an on-resistance which corresponds to K·Ron(PD), wherein K is a scaling factor between the compensation replica and the pass device. $R_1$ may be the resistance of the compensation resistor, and the relationship between the resistance $R_s$ of the sensing resistor and the resistance $R_1$ may be given by $$\frac{R_1}{K} = \frac{R_s}{N},$$

to ensure that the compensation resistance removes the Ron(PD)-dependency of the voltage drop $V_{Rs}$ at the sensing resistor.

The transformation circuit may comprise an auxiliary compensation circuit coupled to one terminal of the sensing resistor. The compensation circuit may be coupled to the other terminal of the sensing resistor. A ratio of a resistance of the auxiliary compensation circuit and of the compensation resistance may be independent of the on-resistance of the pass device. In particular, the resistance of the auxiliary compensation circuit may be equal to the compensation resistance (for different operation conditions of the pass device). This may be beneficial in order to make an offset or a bias of the indication of the load current through the pass device independent of the on-resistance of the pass device.

The transformation circuit may comprise a current source configured to provide a reference current through the auxiliary compensation circuit. As such, there may be a voltage drop across the auxiliary compensation circuit. The transformation circuit may be configured to adjust the output current through the compensation circuit such that a voltage level at the auxiliary compensation circuit corresponds to a voltage level at the compensation circuit. The voltage levels may correspond to the voltage levels at terminals of the compensation circuits which are opposed to the terminals of the compensation circuits which are coupled to the respective terminals of the sensing resistor. By controlling the output current such that the voltage levels at the compensation circuits are equal, it can be ensured that the output current is indicative of the load current through the pass device.

The transformation circuit may comprise an amplification circuit comprising an output transistor which is coupled to the compensation circuit (e.g. at the opposed terminal with respect to the terminal of the compensation circuit which is coupled to a terminal of the sensing resistor). The output transistor may be traversed by the output current, i.e. the output transistor may be arranged in series with the compensation circuit. The output transistor may be controlled such that the voltage level at the auxiliary compensation circuit corresponds to the voltage level at the compensation circuit. In particular, the transformation circuit may comprise a first source follower coupled to (e.g. arranged in series with) the auxiliary compensation circuit and a second source follower coupled to (e.g. arranged in series with) the compensation circuit. The source followers may comprise p-type or n-type transistors. The gates of the first and second source followers may be coupled with one another. The source followers may be used to provide an output current such that the voltage levels at the compensation circuits are equal.

The transformation circuit may comprise an output resistor in series with the compensation circuit. An output voltage at the output resistor may be indicative of the load current through the pass device. In particular, the output voltage may transform the output current into the output voltage.

The pass device and the sensing replica may be p-type transistors and a source of the pass device and a terminal of the sensing resistor may be coupled to the supply voltage. Alternatively, the pass device and the sensing replica may be n-type transistors and a source of the pass device and a terminal of the sensing resistor may be coupled to ground.

According to a further aspect, a method for providing an indication of a load current through a pass device is described. The method comprises providing a sensing replica of the pass device. Furthermore, the method comprises arranging a sensing resistor in series with the sensing replica, such that a voltage drop at the sensing resistor provides an indication of the load current through the pass device. The voltage drop at the sensing resistor is typically dependent on an on-resistance of the pass device. In addition, the method comprises transforming the voltage drop at the sensing resistor into an output current, such that the output current is indicative of the voltage drop at the sensing resistor divided by a compensation resistance of a compensation circuit. The compensation resistance may exhibit a dependency on the on-resistance of the pass device which corresponds to the dependency on the on-resistance of the pass device of the voltage drop at the sensing resistor.

According to a further aspect, a current sensing circuit is described, wherein a current sensing circuit configured to provide an indication of a load current through a pass device, wherein the current sensing circuit comprises a sensing replica of the pass device, a sensing resistor arranged in series with the sensing replica, such that a voltage drop at the sensing resistor provides an indication of the load current through the pass device, wherein the voltage drop at the sensing resistor is dependent on an on-resistance of the pass device, and a transformation circuit configured to transform the voltage drop at the sensing resistor into an output current, such that the output current is indicative of the voltage drop at the sensing resistor divided by a compensation resistance of a compensation circuit, wherein the compensation resistance exhibits a dependency on the on-resistance of the pass device which corresponds to the dependency on the on-resistance of the pass device of the voltage drop at the sensing resistor.

According to another aspect, a method for providing an indication of a load current is described. A method for providing an indication of a load current through a pass device, wherein the method comprises providing a sensing replica of the pass device, arranging a sensing resistor in series with the sensing replica, such that a voltage drop at the sensing resistor provides an indication of the load current through the pass device; wherein the voltage drop at the sensing resistor is dependent on an on-resistance of the pass device, and transforming the voltage drop at the sensing resistor into an output current, such that the output current is indicative of the voltage drop at the sensing resistor divided by a compensation resistance of a compensation circuit, wherein the compensation resistance exhibits a dependency on the on-resistance of the pass device which corresponds to the dependency on the on-resistance of the pass device of the voltage drop at the sensing resistor.

It should be noted that the methods and systems including its preferred embodiments as outlined in the present document may be used stand-alone or in combination with the other methods and systems disclosed in this document. In addition, the features outlined in the context of a system are also applicable to a corresponding method. Furthermore, all aspects of the methods and systems outlined in the present document may be arbitrarily combined. In particular, the features of the claims may be combined with one another in an arbitrary manner.

In the present document, the term "couple" or "coupled" refers to elements being in electrical communication with each other, whether directly connected e.g., via wires, or in some other manner.

BRIEF DESCRIPTION OF THE DRAWINGS

The invention is explained below in an illustrative manner with reference to the accompanying drawings, wherein.

DESCRIPTION

As outlined above, the present document addresses the technical problem of sensing the current through a power switch in a reliable manner, for different operational conditions of the power switch.

Current sense circuits may be used in integrated circuits. If a potentially large output current, or load current, is to be driven by an on-chip switch, a current sense circuit may be used to detect the relative or absolute value of this current. The current level may be monitored to prevent damage to the switch, or to the integrated circuit from either a short circuit or an overload. Alternatively or in addition, the current level may be monitored for controlling the switching state of the power switch.

The power switch may be used e.g. within a buck converter which converts an input voltage to a lower output voltage. The power switch may be implemented as a transistor (e.g. a metal oxide semiconductor, MOS, field effect transistor, FET), which is driven by a pulse-width-modulated control voltage. The switch is turned on and off by the pulse-width-modulated control voltage. As indicated above, it may be important to sense the current through the power switch (when the power switch is turned on) with a minimum efficiency loss, short settling time and good stability against process variations.

Figure 1:
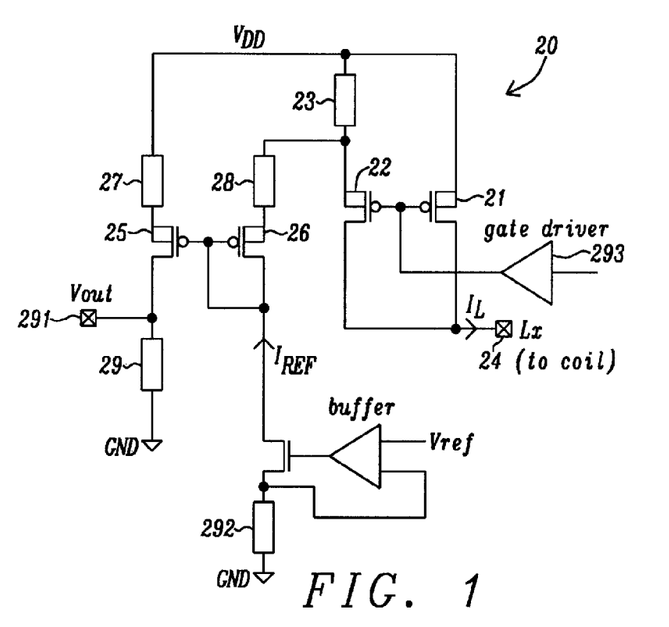
FIG. 1 shows a circuit diagram of a power switch and an example current sensing circuit.

FIG. 1 shows a block diagram of an example current sensing circuit 20 in conjunction with the power switch or pass device 21, through which the load current $I_L$, which is to be sensed, is flowing. In the illustrated example, the pass device 21 is a PMOS transistor. The current sensing circuit 20 may comprise a PMOS source follower 22 to the PMOS pass device 21. A sensing resistor 23 may be connected to the source of the source follower 22 and to the source of the pass device 21 and to the main supply voltage $V_{DD}$. The source of the pass device 21 may also be connected to the supply voltage $V_{DD}$. The drain of the pass device 21 and the drain of the source follower 22 may be connected to a pin 24, which may be, connected e.g. to the external inductor (coil) of a DC/DC buck converter. The gate driver 293 defines the operation point and the switching of the PMOS pass device 21 and of the PMOS source follower 22. A switching frequency of 1 MHz may be used.

The fraction of the output current $I_L$, which is supplied by the source follower 22 (also referred to as a sensing replica of the pass device 21) typically depends on the resistance of the sensing resistor 23 and/or on the geometrical relationship of the size of the source follower transistor 22 compared with the size of the pass device 21. By way of example, the size of the pass device 21 may be N times the size of the source follower transistor 22. As a result of this, the on-resistance Ron(SF) of the source follower transistor 22 may be N times higher than the on-resistance Ron(PD) of the pass device 21. By consequence, the fraction of the load current $I_L$, which is supplied by the source follower 22, may be N time smaller than the fraction of the load current $I_L$, which is supplied by the pass device 21.

The voltage drop across the sensing resistor 23 may be mirrored with a second pair of PMOS source followers 25 and 26, working as a current mirror from one side of said pair to the other side. In order to adjust an offset and an amplification factor, resistor 27 may be added to the leg of source follower 25 and resistor 28 may be added to the leg of source follower 26. The ratio of the resistance of resistors 27 and 28 may be used- to adjust the offset of the pair of source followers 25 and 26. Between the drain side of source follower 25, which is the output side of the current sense signal Vout 291, and ground another resistor 29 may be applied. The amplification factor of said pair of source followers 25 and 26 may be defined by the ratio of the resistance of resistor 27 ($R_1$) to the resistance of resistor 29 ($R_2$). The output voltage Vout 291 typically represents the size of the load current $I_L$.

The current sensing circuit 20 may further comprise a biasing circuit or current source configured to provide a reference current $I_{REF}$. Using resistor 292 as a reference resistor, the reference current $I_{REF}$ may be created, wherein the reference current defines the operation point of the pair of source followers 25 and 26. The reference current $I_{REF}$ may track the voltage reference $V_{REF}$ and may compensate for process variations.

The voltage drop Vout 291 may be proportional to the current in the pass device 21. This may be achieved by supplying a fraction of the load current $I_L$ out of the source follower 22, which matches the pass device 21. Hence, the voltage drop at the sensing resistor 23 provides an indication of the current through the pass device 21 (which is substantially equal to the load current $I_L$, if the ratio N is large, e.g. N>=100). It can be shown that the output voltage Vout 291 depends on the load current $I_L$ according to the following formula:

$$V\text{out} = V_0 + I_L \cdot Ron(PD) \cdot \frac{R_s}{R_s + Ron(SF)} \cdot \frac{R_2}{R_1},$$

wherein $V_0$ is an offset voltage which depends on the biasing resulting from the reference current $I_{REF}$ and wherein $R_s$ is the resistance of the sensing resistor 23. The above formula assumes that the resistances of the resistor 27 and 28 are both equal, i.e. $R_1$.

As indicated above, Ron(SF)=N·Ron(PD), such that $$V\text{out} = V_0 + I_L \cdot Ron(PD) \cdot \frac{R_s}{R_s + N \cdot Ron(PD)} \cdot \frac{R_2}{R_1}.$$

The above formula shows that the level of the output voltage Vout 291 is indicative of the load current $I_L$. The above formula also shows that the level of the output voltage Vout 291 depends on the on-resistance of the pass device 21 Ron (PD). This on-resistance is typically dependent on the operational conditions of the pass device 21, such as the temperature and/or the supply voltage $V_{DD}$. Hence, the level of the output voltage Vout 291 depends on the operational conditions of the pass device 21. Consequently, the operational conditions of the pass device 21 impact the precision of the indication of the load current $I_L$.

Figure 2A:
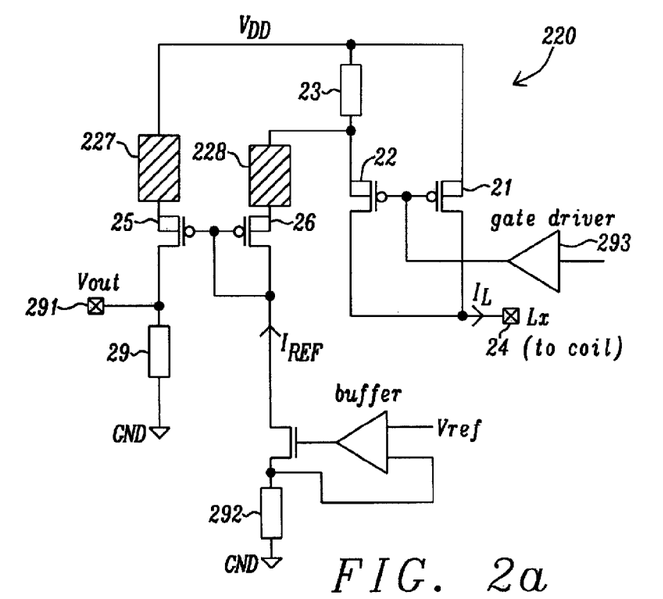
FIGS. 2a and 2b show circuit diagrams of a power switch and an example current sensing circuit which exhibits increased reliability with regards to changing operational conditions of the power switch.

In the present document, it is proposed to modify the current sensing circuit 20 of FIG. 1, in order to make the current sensing circuit 20 independent of or at least less dependent on the operational conditions of the pass device 21. In particular, it is proposed to design the current sensing circuit 20 such that it is configured to compensate the dependency on the operational conditions of the pass device 21. Even more particularly, it is proposed to make use of compensation circuits 227, 228 in conjunction with the source followers 25, 26 of the current sensing circuit 220. This is illustrated in FIG. 2a, where the resistors 27, 28 are replaced by compensation circuits 227, 228, to provide the current sensing circuit 220.

The compensation circuit 227, 228 may be configured to provide a resistance $R_e$ which compensates the dependency of the output voltage Vout 291 on the dependency of the on-resistance Ron(PD). Based on the above mentioned formula and by replacing the resistance $R_1$ of the resistors 27, 28 by the resistance $R_c$ of the compensation circuits 227, 228, the output voltage Vout 291 for the current sensing circuit 220 of FIG. 2 is given by:

$$Vout = V_0 + I_L \cdot Ron(PD) \cdot \frac{R_s}{R_s + N \cdot Ron(PD)} \cdot \frac{R_2}{R_C}.$$

The resistance $R_C$ may be selected such that the output voltage Vout 291 is independent of the on-resistance Ron(PD) of the pass device 21. In particular, the resistance $R_C$ may be selected such that $$I_L \cdot Ron(PD) \cdot \frac{R_s}{R_s + N \cdot Ron(PD)} \cdot \frac{R_2}{R_C} = C,$$

wherein C is a value which may be constant, and/or a value which is independent of the operation conditions of the pass device 21.

Figure 3:
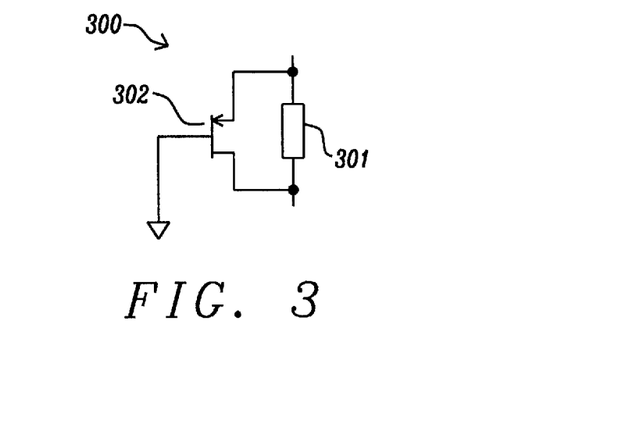
FIG. 3 illustrates example compensation circuits.

FIG. 3 shows an example compensation circuit 300 which may be used as compensation circuits 227, 228 in the current sensing circuit 220 of FIG. 2. The compensation circuit 300 comprises a resistor 301 which is arranged in parallel with a switch 302. The switch 302 may be or may comprise a PMOS transistor which exhibits an on-resistance Ron(C)=K·Ron (PD). The resistor 301 may have a resistance $R_1$, and the resistance $R_C$ (also referred to as the compensation resistance) of the compensation circuit 300 may be given by:

$$R_C = \frac{R_1 \cdot K \cdot Ron(PD)}{R_1 + K \cdot Ron(PD)}.$$

Hence the output voltage Vout 291 is given by:

$$Vout = V_0 + I_L \cdot \frac{R_s \cdot Ron(PD)}{R_1 \cdot K \cdot Ron(PD)} \cdot \frac{R_1 + K \cdot Ron(PD)}{R_s + N \cdot Ron(PD)} \cdot R_2,$$

$$Vout = V_0 + I_L \cdot \frac{R_s}{R_1 \cdot K} \cdot \frac{R_1 + K \cdot Ron(PD)}{R_s + N \cdot Ron(PD)} \cdot R_2.$$

The above formula is independent of the on-resistance Ron(PD) of the pass device 21, if $$\frac{R_1 + K \cdot Ron(PD)}{R_s + N \cdot Ron(PD)}$$

is a constant value, i.e. if $$\frac{R_1}{K} = \frac{R_s}{N}.$$

Hence, by selecting the resistance $R_1$ of the compensation resistor 301 and the on-resistance Ron(C) of the compensation transistor 302 of the compensation circuit 300 using the above formula, the output voltage Vout 291 becomes independent of the operation conditions of the pass device 21, thereby providing a reliable current sensing device 220, which does not depend on the operating conditions of the pass device 21. In this case, the output voltage Vout 291 is given by:

$$Vout = V_0 + I_L \cdot \frac{N}{K} \cdot R_2.$$

It should be noted that other compensation circuits 300 may be designed, such that the on-resistance dependency of the output voltage Vout 291 is removed.

The pass device 21 may exhibit a non-negligible metal resistance $R_m$, which is typically independent of the operational conditions of the pass device 21. The metal resistance $R_m$ of the pass device 21 may be taken into account by replacing the on-resistance Ron(PD) of the pass device 21 by the term Ron(PD)+$R_m$, which represents the seriel arrangement of temperature and supply voltage $V_{DD}$ dependent on-resistance Ron(PD) and the metal resistance $R_m$ which is typically independent of the temperature and supply voltage $V_{DD}$.

In order to take into account the metal resistance $R_m$, the sensing replica 22 may be designed such that the sensing replica 22 exhibits a total resistance which is given by N·(Ron(PD)+$R_m$). In a similar manner, the compensation switch 302 (referred to as a compensation replica) of the compensation circuit 300 may be designed such that its resistance is given by K·(Ron(PD)+$R_m$). Hence, the replicas 22, 302 of the pass device 21 may be designed that that they exhibit the same relative fraction of a metal resistance as the pass device 21.

Figure 4A:
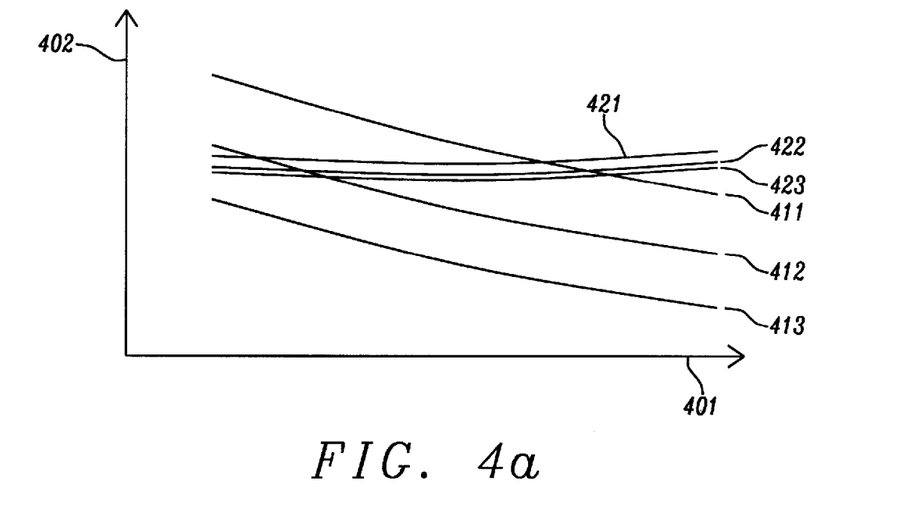
FIGS. 4a and 4b illustrate example experimental results.
Figure 4B:
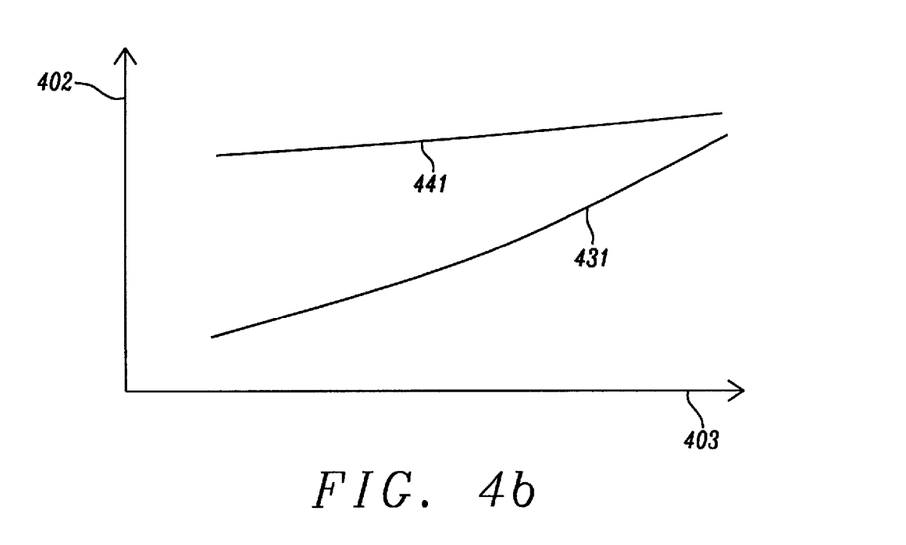

The benefits of using the compensation circuits 227, 228 may be seen in FIGS. 4a and 4b. FIG. 4a shows the output voltage Vout 402 in dependency of the supply voltage $V_{DD}$ 401 for the current sensing circuit 20 (curves 411, 412, 413) and for the current sensing circuit 220 (curves 421, 422, 423). The output voltage Vout 402 is shown for different load currents. It can be seen that the output voltage Vout 402 is flat, when using the compensation circuits 227, 228 in current sensing circuit 220. Hence, the indication of the load current is independent of the supply voltage $V_{DD}$ 401.

In a similar manner, FIG. 4b shows the output voltage Vout 402 in dependency of the temperature 403 for the current sensing circuit 20 (curve 431) and for the current sensing circuit 220 (curve 441). It can be seen that the output voltage Vout 402 is flat, when using the compensation circuits 227, 228 in current sensing circuit 220. Hence, the indication of the load current is independent of the temperature 403.

Figure 2B:
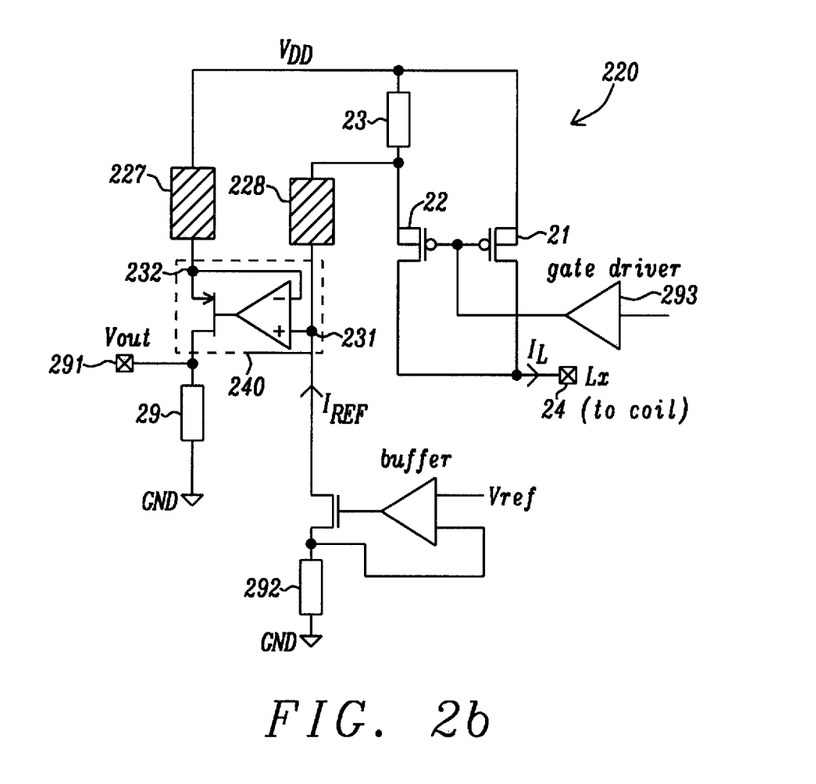

The operation of the current sensing circuit 220 is further outlined in the context of FIG. 2b. In FIG. 2b, the source followers 25, 26 have been replaced by an amplification circuit 240 which is configured to set the current Iout through the output resistor 29 such that the voltage $V_2$ 232 at the output of the amplification circuit 240 is equal to the voltage $V_1$ 231 at the input of the amplification circuit 240. As such, the amplification circuit 240 has a behavior which corresponds to the behavior of the coupled source followers 25, 26. The voltage drop $V_{Rs}$ at the sensing resistor 23 is given by:

$$V_{RS} = I_L \cdot Ron(PD) \cdot \frac{R_s}{R_s + N \cdot Ron(PD)}.$$

Furthermore, it may be seen from FIG. 2b that $$V_{DD} - V_2 = V_{Rs} + V_{c1},$$

wherein the voltage drop $V_{c1}$ at the first compensation circuit 228 (also referred to as the auxiliary compensation circuit) is given by $V_{c1} = I_{ref} \cdot R_{c1}$, wherein $R_{c1}$ is the resistance of the first compensation circuit 228. The current Iout through the output resistor 29 is given by $$I_{out} = \frac{V_{DD} - V_2}{R_{c2}} = \frac{V_{RS} + V_{c1}}{R_{c2}} = \frac{V_{RS}}{R_{c2}} + \frac{R_{c1}}{R_{c2}} \cdot I_{ref},$$

wherein $R_{c2}$ is the compensation resistance of the second compensation circuit 227 (also referred to as the compensation circuit). The output voltage Vout 291 is then given by Vout=$I_{out} \cdot R_2$ and $$Vout = \frac{R_2 \cdot R_{c1}}{R_{c2}} \cdot I_{ref} + \frac{R_2}{R_{c2}} I_L \cdot Ron(PD) \cdot \frac{R_s}{R_s + N \cdot Ron(PD)}.$$

The first term of the above mentioned formula corresponds to $V_O$ and depends on the reference current $I_{ref}$. The resistances of the first and second compensation circuits 227, 228 may be such that the ratio $$\frac{R_{c1}}{R_{c2}}$$

is independent of the operating conditions of the pass device 21. For this purpose, the resistances of the first and second compensation circuits 227, 228 do not necessarily need to be equal (as assumed in the context of FIG. 2a). The resistance of the second compensation circuit 227 may be selected as outlined above, in order to make the second term of the above mentioned formula independent of the on-resistance of the pass device 21.

Figure 5A:
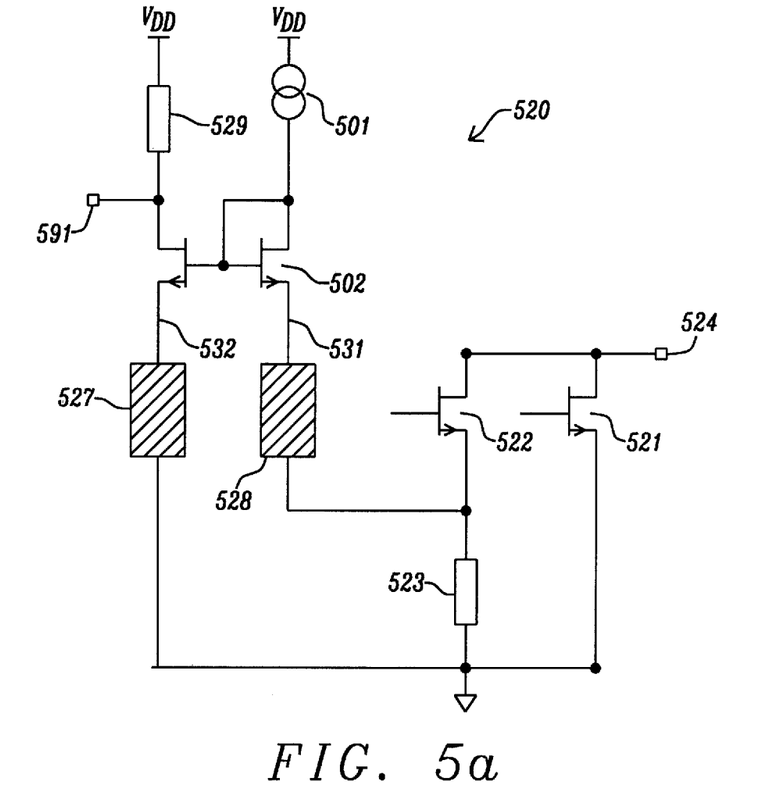
FIG. 5a shows a circuit diagram of an n-type power switch and an example current sensing circuit.

FIG. 5a shows a current sensing circuit 520 for an n-type pass device 521. The current sensing circuit 520 is configured to provide an indication of the load current at the pin 524 as an output voltage Vout 591. The current sensing circuit 520 comprises a sensing replica 522 and a sensing resistor 523 which are arranged in parallel with the pass device 521. Furthermore, the current sensing circuit 520 comprises a transformation circuit, which provides an amplified or attenuated version of the voltage drop across the sensing resistor 523 as output voltage Vout 591. Furthermore, the transformation circuit is configured to translate the voltage drop across the sensing resistor 523 into the output voltage Vout 591 which is referred to the supply voltage $V_{DD}$ and/or to ground. In addition, the transformation circuit may be configured to remove the Ron(PD)-dependency from the voltage drop across the sensing resistor 523.

The transformation circuit comprises a current source 501 which is configured to provide a reference current $I_{ref}$ through a first compensation circuit 528 (also referred to as the auxiliary compensation circuit). The reference current $I_{ref}$ may be used to tune the operating point of the transformation circuit. Furthermore, the transformation circuit comprises an amplification circuit 502 configured to ensure that the voltage 532 at a second compensation circuit 527 (also referred to as the compensation circuit) corresponds to or is an amplified or attenuated version of the voltage 531 at the first compensation circuit 528. In addition, the transformation circuit comprises an output resistor 529, wherein the voltage drop 591 at the output resistor 529 (with reference to the supply voltage $V_{DD}$) provides an indication of the load current at the pin 524.

Figure 5B:
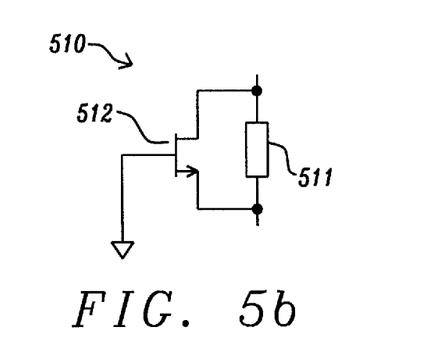
FIG. 5b illustrates example compensation circuits for the current sensing circuit of FIG. 5a; and, FIG. 6 shows a flow chart of an example method.

FIG. 5b shows a circuit diagram of an example compensation circuit 510 which may be used as the first and/or second compensation circuits 528, 527. The compensation circuit 510 comprises a compensation transistor 512 arranged in parallel to a compensation resistor 511. When using such a compensation circuit 510, the output voltage 591 may provide an indication of the load current, which is independent of the operation conditions of the pass device 521.

Figure 6:
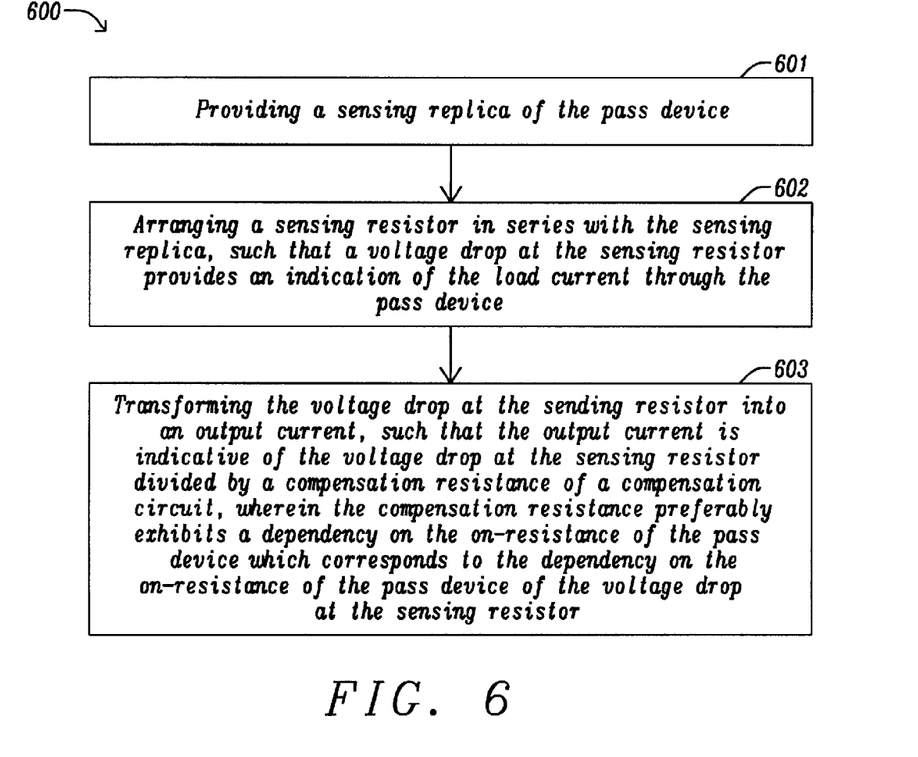

FIG. 6 shows a flow chart of an example method 600 for providing an indication of a load current through a pass device 21. The method 600 comprises providing 601 a sensing replica 22 of the pass device 21. Furthermore, the method 600 comprises arranging 602 a sensing resistor 23 in series with the sensing replica 22, such that a voltage drop at the sensing resistor 23 provides an indication of the load current through the pass device 21. In addition, the method 600 comprises transforming 603 the voltage drop at the sensing resistor 23 into an output current, such that the output current is indicative of the voltage drop at the sensing resistor 23 divided by a compensation resistance of a compensation circuit 227. The compensation resistance preferably exhibits a dependency on the on-resistance of the pass device 21 which corresponds to the dependency on the on-resistance of the pass device 21 of the voltage drop at the sensing resistor 23.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

What is claimed is:

1. A current sensing circuit configured to provide an indication of a load current through a pass device, wherein the current sensing circuit comprises     a sensing replica of the pass device;

a sensing resistor arranged in series with the sensing replica, such that a voltage drop at the sensing resistor provides an indication of the load current through the pass device; wherein the voltage drop at the sensing resistor is dependent on an on-resistance of the pass device; and     a transformation circuit configured to transform the voltage drop at the sensing resistor into an output current, such that the output current is indicative of the voltage drop at the sensing resistor divided by a compensation resistance of a compensation circuit; wherein the compensation resistance exhibits a dependency on the on-resistance of the pass device which corresponds to the dependency on the on-resistance of the pass device of the voltage drop at the sensing resistor.

2. The current sensing circuit of claim 1, wherein the sensing replica and the sensing resistor are arranged in parallel to the pass device;

the pass device and the sensing replica are controlled in synchronicity; and/or     the sensing replica exhibits an on-resistance which is larger than the on-resistance of the pass device by a pre-determined scaling factor N.

3. The current sensing circuit of claim 1, wherein the compensation resistance is proportional to $$\frac{N \cdot Ron(PD)}{R_s + N \cdot Ron(PD)},$$

wherein $R_s$ is the resistance of the sensing resistor, wherein Ron(PD) is the on-resistance of the pass device, and wherein N is a scaling factor between the sensing replica and the pass device.

4. The current sensing circuit of claim 1, wherein the compensation circuit comprises a parallel arrangement of
a compensation resistor; and
a compensation replica of the pass device.

5. The current sensing circuit of claim 4, wherein $$\frac{R_1}{K} = \frac{R_s}{N},$$

with $R_1$ being the resistance of the compensation resistor, $R_s$ being the resistance of the sensing resistor, N being a scaling factor between the sensing replica and the pass device and K being a scaling factor between the compensation replica and the pass device.

6. The current sensing circuit of claim 1, wherein
the transformation circuit comprises an auxiliary compensation circuit coupled to one terminal of the sensing resistor;
the compensation circuit is coupled to the other terminal of the sensing resistor;
the transformation circuit comprises a current source configured to provide a reference current through the auxiliary compensation circuit;
the transformation circuit is configured to adjust the output current through the compensation circuit such that a voltage level at the auxiliary compensation circuit corresponds to a voltage level at the compensation circuit.

7. The current sensing circuit of claim 6, wherein a ratio of a resistance of the auxiliary compensation circuit and of the compensation resistance is independent of the on-resistance of the pass device.

8. The current sensing circuit of claim 7, wherein the resistance of the auxiliary compensation circuit is equal to the compensation resistance.

9. The current sensing circuit of claim 6, wherein
the transformation circuit comprises an amplification circuit comprising an output transistor coupled to the compensation circuit;
the output transistor is traversed by the output current; and
the output transistor is controlled such that the voltage level at the auxiliary compensation circuit corresponds to the voltage level at the compensation circuit.

10. The current sensing circuit of claim 6, wherein
the transformation circuit comprises a first source follower coupled to the auxiliary compensation circuit and a second source follower coupled to the compensation circuit; and
gates of the first and second source followers are coupled with one another.

11. The current sensing circuit of claim 1, wherein
the transformation circuit comprises an output resistor in series with the compensation circuit; and
an output voltage at the output resistor is indicative of the load current through the pass device.

12. The current sensing circuit of claim 1, wherein the pass device and the sensing replica are metal oxide semiconductor transistors.

13. The current sensing circuit of claim 1, wherein
the pass device and the sensing replica are p-type transistors; and
a source of the pass device and a terminal of the sensing resistor are coupled to a supply voltage.

14. The current sensing circuit of claim 1, wherein
the pass device and the sensing replica are n-type transistors; and
a source of the pass device and a terminal of the sensing resistor are coupled to ground.

15. A method for providing an indication of a load current through a pass device, wherein the method comprises
providing a sensing replica of the pass device;
arranging a sensing resistor in series with the sensing replica, such that a voltage drop at the sensing resistor provides an indication of the load current through the pass device; wherein the voltage drop at the sensing resistor is dependent on an on-resistance of the pass device; and
transforming the voltage drop at the sensing resistor into an output current, such that the output current is indicative of the voltage drop at the sensing resistor divided by a compensation resistance of a compensation circuit; wherein the compensation resistance exhibits a dependency on the on-resistance of the pass device which corresponds to the dependency on the on-resistance of the pass device of the voltage drop at the sensing resistor.

16. The method of claim 15 wherein the compensation circuit comprises a parallel arrangement of a compensation resistor; and a compensation replica of the pass device.

17. The method of claim 16, wherein $$\frac{R_1}{K} = \frac{R_s}{N},$$

with $R_1$ being the resistance of said compensation resistor, $R_s$ being the resistance of the sensing resistor, N being a scaling factor between the sensing replica and the pass device and K being a scaling factor between said compensation replica and said pass device.

18. The method of claim 15, wherein
said sensing replica and said sensing resistor are arranged in parallel to said pass device;
said pass device and said sensing replica are controlled in synchronicity; and/or
said sensing replica exhibits an on-resistance which is larger than the on-resistance of said pass device by a pre-determined scaling factor N.

19. The method of claim 15 wherein the said pass device is a metal oxide semiconductor transistor.

20. The method of claim 19 wherein said pass device is a PMOS transistor.

21. The method of claim 15 wherein said sensing replica is a metal oxide semiconductor transistor.

* * * * *